(12) United States Patent
Faehnrich

(10) Patent No.: US 9,207,282 B2
(45) Date of Patent: Dec. 8, 2015

(54) SMOOTH VI MODE CROSSOVER METHOD AT COMPLIANCE LIMIT THRESHOLD

(71) Applicant: Richard John Faehnrich, Arlington Heights, IL (US)

(72) Inventor: Richard John Faehnrich, Arlington Heights, IL (US)

(73) Assignee: Teradyne, Inc., North Reading, MA (US)

( * ) Notice: Subject to any disclaimer, the term of this patent is extended or adjusted under 35 U.S.C. 154(b) by 334 days.

(21) Appl. No.: 13/804,579

(22) Filed: Mar. 14, 2013

(65) Prior Publication Data

US 2014/0266270 A1    Sep. 18, 2014

(51) Int. Cl.
  *G01R 31/00* (2006.01)
  *G01R 31/319* (2006.01)
  *G01R 31/30* (2006.01)

(52) U.S. Cl.
  CPC ...... *G01R 31/31924* (2013.01); *G01R 31/3004* (2013.01)

(58) Field of Classification Search
  CPC ............... G01R 31/3004; G01R 27/14; G01R 31/2841; G01R 31/31924; G01R 15/12; G01R 31/2839
  USPC ............ 324/762.01–762.1, 522, 713, 764.01, 324/750.01
  See application file for complete search history.

(56) References Cited

U.S. PATENT DOCUMENTS

| | | | |
|---|---|---|---|
| 6,452,436 B1 | 9/2002 | Leip | |
| 7,903,008 B2 | 3/2011 | Regier | |
| 2004/0135591 A1 | 7/2004 | Tsutsui | |
| 2006/0087871 A1* | 4/2006 | Vulovic | 363/73 |
| 2007/0185590 A1* | 8/2007 | Reindel et al. | 700/22 |
| 2008/0079406 A1* | 4/2008 | Holmquist et al. | 323/283 |
| 2009/0121908 A1 | 5/2009 | Regier | |
| 2012/0306460 A1* | 12/2012 | Regier et al. | 323/234 |
| 2012/0306559 A1* | 12/2012 | Regier et al. | 327/306 |

FOREIGN PATENT DOCUMENTS

WO   WO 2011/066554 A2   6/2011

OTHER PUBLICATIONS

PCT Notification of Transmittal of the International Search Report and the Written Opinion of the International Searching Authority in PCT/US2014/021915 mailed Jul. 7, 2014, 7 pages.

* cited by examiner

*Primary Examiner* — Arleen M Vazquez
*Assistant Examiner* — Lee Rodak
(74) *Attorney, Agent, or Firm* — Wolf, Greenfield & Sacks, P.C.

(57) ABSTRACT

Source measure units may operate as a voltage/current (V/I) source for a load, such as a device under test (DUT). Source measure units having a voltage controlled mode and a current controlled mode are described. The source measure units may have a suitable configuration to transition between the voltage controlled mode and current controlled mode in a smooth manner, and may be operated accordingly.

25 Claims, 6 Drawing Sheets

SMOOTH VI MODE CROSSOVER METHOD AT COMPLIANCE LIMIT THRESHOLD

FIELD

The technology described herein relates to source measure units and methods of operation of the same.

RELATED ART

Source measure units (SMUs) are used in some automated test equipment (ATE) to provide a source voltage or current signal to a device under test (DUT).

SUMMARY

According to an aspect of the present application, a method of operating a source measure unit (SMU) configured to couple to a load is provided. The SMU may operate in a plurality of modes including a voltage-controlled mode and a current-controlled mode. The method may comprise generating a control signal to apply to a control circuit of the SMU when switching between the plurality of modes, wherein generating the control signal comprises generating the control signal based on both a voltage and a current.

According to an aspect of the present application, a source measure unit (SMU) configured to operate in a plurality of modes including a voltage-controlled mode and a current-controlled mode is provided. The SMU may comprise combination circuitry configured to generate, when the SMU transitions between the voltage-controlled mode and the current controlled mode, a control signal to provide to a control circuit of the SMU, the control signal being based on both a voltage and a current.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
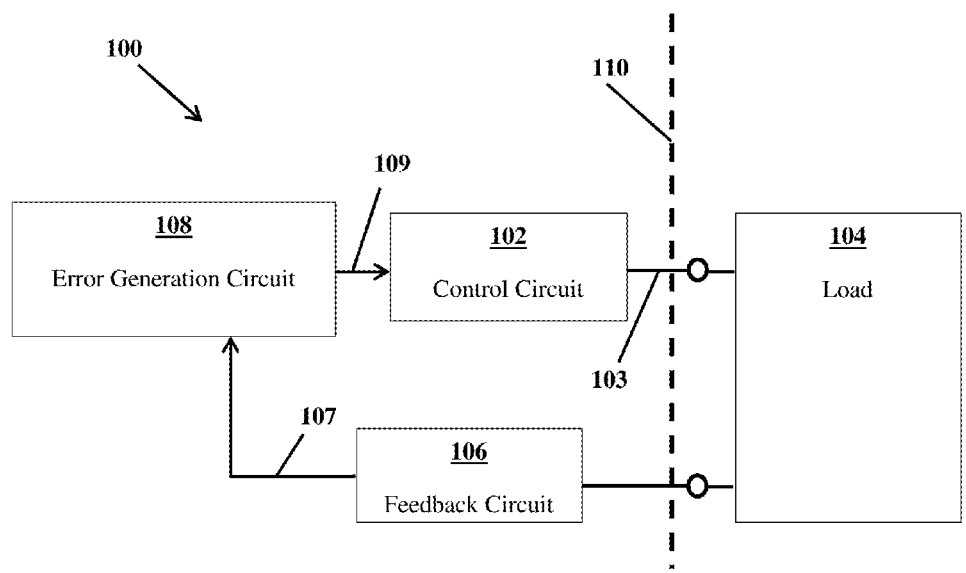
FIG. 1 illustrates a SMU according to a non-limiting embodiment coupled to a load.

Some source measure units (SMUs) are operable as either a voltage source or a current source, and thus are sometimes referred to as V/I sources. The SMU may provide an output signal (sometimes referred to as a drive signal), for example to a load such as a DUT, having a voltage and a current. When operating as a voltage source, the voltage of the output signal applied across the load may be considered the main, and may be intended to assume a target value. The current through the load may be considered the limit, and may be intended to stay within a desired current range (e.g., upper and lower current thresholds or compliance limits which may be symmetrical or asymmetrical about zero). When operating as a current source, the current of the output signal passing through the load may be considered the main, and may be intended to assume a target value. The voltage across the load may be considered the limit, and may be intended to stay within a desired voltage range (e.g., upper and lower voltage thresholds or compliance limits).

In a voltage controlled mode, the voltage across the load may be compared to the target voltage, and any difference between the two may be used to generate a control signal (e.g., within the SMU) to adjust the voltage of the output signal provided by the SMU. The current through the load may be monitored, but so long as it remains within the compliance limits may not impact the control signal.

In a current controlled mode, the current through the load may be compared to the target current, and any difference between the two may be used to generate a control signal (e.g., within the SMU) to adjust the current of the output signal provided by the SMU. The voltage across the load may be monitored, but so long as it remains within the compliance limits may not impact the control signal.

The SMUs may be switched between a voltage controlled mode and a current controlled mode, when the limit signal (the current in the voltage controlled mode scenario and the voltage in the current controlled mode scenario) falls outside the compliance limits. The limit signal then becomes the main signal and the main signal becomes the limit signal. Such behavior may be described as a switch between main control (when the value of the main signal dictates operation of the SMU) and limit control (when the value of the limit signal dictates operation of the SMU).

Applicants have appreciated that abrupt or discontinuous switching between the voltage controlled mode and the current controlled mode of the SMU can give rise to undesirable behavior. For example, discontinuous switching between a voltage controlled mode and a current controlled mode can cause noise in the output signal, chatter, oscillation, or other undesirable behaviors. Such behaviors may, for example, cause erroneous test results when the SMU is being used in combination with ATE to test a DUT, or may cause other undesirable behaviors.

Accordingly, aspects of the present application provide SMUs and methods of operating SMUs that achieve smooth or continuous switching between main control and limit control (e.g., between voltage controlled modes and current controlled modes) of the SMU. The smooth transition (which may also be referred to as crossover) may be achieved, for example, by creating a drive signal for the SMU which is based on both the voltage across the load and the current through the load, rather than only one or the other. As a non-limiting example, when a determination is made that the limit signal falls outside the compliance limits (or compliance range or threshold range), transition between the main mode and the limit mode may be initiated. During the transition the error of the limit signal may be combined suitably with the error of the main signal to generate the drive signal used to adjust the output signal of the SMU. By combining the errors of the main signal and limit signal a smooth transition may be provided, which may avoid the drawbacks associated with an abrupt or discontinuous switch between voltage controlled and current controlled modes.

The aspects and embodiments described above, as well as additional aspects and embodiments, are described further below. These aspects and/or embodiments may be used individually, all together, or in any combination of two or more, as the application is not limited in this respect.

FIG. 1 illustrates a non-limiting example of a SMU 100 according to an aspect of the present application coupled to a load. The SMU may be configured to exhibit smooth transitions between a main control mode and a limit control mode.

As shown, the SMU 100, which includes the components to the left of dashed line 110, comprises a control circuit 102 for controlling generation of an output signal 103 to be provided to the load 104. The output signal 103 may also be considered a drive signal for driving the load. A feedback circuit 106 may provide one or more feedback signals 107 to an error generation circuit 108. The one or more feedback signals 107 may be representative of a voltage across the load 104 and/or a current through the load 104. The error generation circuit 108 may determine errors in the main signal (e.g., voltage in a voltage controlled mode and current in a current controlled mode) and the limit signal (e.g., current in a voltage controlled mode and voltage in a current controlled mode) and generate a control signal 109 to provide to the control circuit 102 for controlling the output signal 103. When transitioning between main control and limit control modes, the error generation circuit may produce a control signal 109 based on both an error of the main signal and an error of the limit signal. Such operation is described in further detail below with respect to FIG. 2.

The circuitry of SMU 100 may take any suitable form for performing in the described manner. A non-limiting detailed example is described below in connection with FIG. 4. The load 104 may be any suitable load. In some embodiments, the load may be a DUT, such as a semiconductor device (e.g., a memory device) or other device to be tested with ATE or otherwise. However, the various aspects described herein are not limited to use with any particular type(s) of load.

Figure 2:
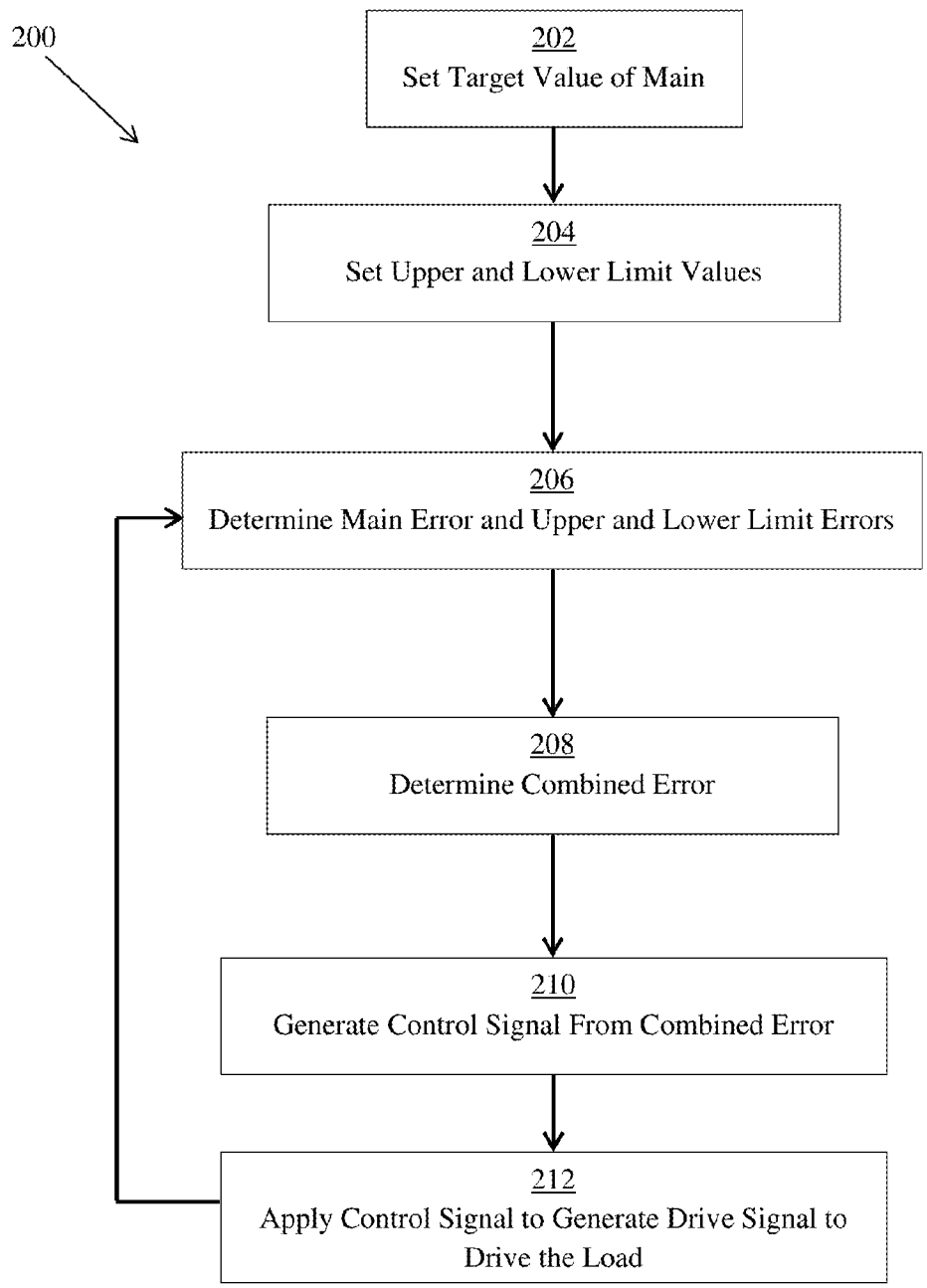
FIG. 2 illustrates a method of operating a source measure unit (SMU) according to a non-limiting embodiment of the present application.

FIG. 2 illustrates a method of operating a source measure unit (SMU), such as SMU 100 of FIG. 1, according to a non-limiting embodiment of the present application. The method may provide for smooth (or continuous) transitions (or crossover) between main control and limit control modes.

The method 200 begins at stage 202 with setting a target value of the main signal (e.g., the voltage of the SMU output signal in a voltage controlled mode and the current of the SMU output signal in a current controlled mode). At stage 204, a compliance range for the limit signal may be set, including upper and lower limit values, which may also be referred to as threshold values or compliance limits. It should be appreciated that stages 202 and 204 may be performed in any suitable order, including being performed at substantially the same time, as the method 200 is not limited in this respect.

At stage 206, errors may be determined, including an error of the main signal and one or more errors of the limit signal. For example, in scenarios in which a compliance range with upper and lower compliance limits is established at stage 204, errors of the limit signal with respect to both the upper and lower compliance limits may be determined.

At stage 208, a combined or mixed error (which may also be referred to herein as a total error) may be determined from the errors determined in stage 206. The combined error may then be used to generate a control signal (e.g., control signal 109 of FIG. 1) at stage 210. In some embodiments, the combined error may itself serve as the control signal, i.e., the combined error may be sent without modification to a control circuit which then generates a drive signal (e.g., output signal 103). However, the method 200 also contemplates scenarios in which the combined error may be modified in some manner (e.g., scaled, amplified, etc.) to become the control signal that then gets sent to a control circuit.

At stage 212, the control signal generated at stage 210 may be used to generate the drive signal (or output signal) of the SMU to drive the load. For example, the control signal generated at stage 210 may be sent to a control circuit which, in response to receiving the control signal, generates a drive signal. Thus, it should be appreciated that method 200 provides a manner of operating an SMU in which the drive signal or output signal of the SMU is based on errors in both the main and limit signals. This is to be contrasted with approaches in which only the errors in the main signal are used to generate the drive signal, and in which abrupt switches between the main control and limit control modes are exhibited.

The method 200 may be iterative, as indicated by the arrow connecting stages 212 and 206. Any number of desired iterations may be performed during operation of the SMU. In some embodiments, the loop represented by stages 206, 208, 210, and 212 may be performed continuously or substantially continuously during operation of the SMU. In some embodiments, stages 202 and 204 may be performed only once when initializing the SMU, or may be performed at various times when it is desired to adjust the target value for the main signal and the compliance range for the limit signal.

Figure 3:
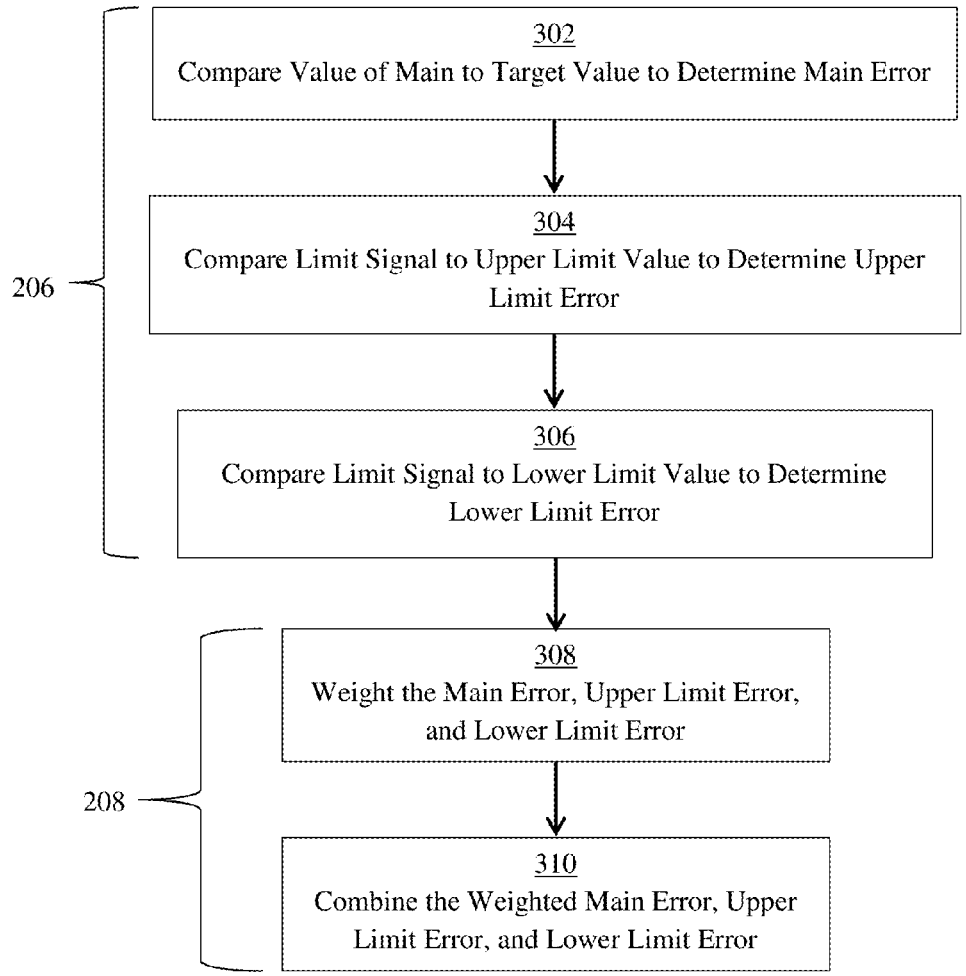
FIG. 3 illustrates a more detailed method expanding on the method of FIG. 2, according to a non-limiting embodiment.

Stages 206 and 208 may be performed in various manners, and the method 200 is not limited to the particular manner of implementing those stages. FIG. 3, however, illustrates a non-limiting manner of implementing stages 206 and 208.

As shown, stage 206 may comprise performance of three stages (or sub-stages) 302, 304, and 306. At stage 302, the main error (i.e., the error of the main signal) may be determined by comparing the value of the main signal to the target value of the main signal. At stage 304, an upper limit error may be determined by comparing the value of the limit signal to the upper limit threshold or value. At stage 308, the lower limit error may be determined by comparing the value of the limit signal to the lower limit threshold or value.

Thus, stage 206 may produce three error components in some embodiments: a main error component; an upper limit error component; and a lower limit error component. Stage 208 may then generate a combined error by suitable combination of these error components.

As shown in FIG. 3, stage 208 may, in some embodiments, comprise two stages (or sub-stages) 308 and 310. At stage 308, the main error, upper limit error, and lower limit error determined from stage 206 may be weighted. The weighting may be static (i.e., the weighting of the main error and upper and lower limit errors may not change during operation of the SMU) or variable (i.e., the weighting of the main error and/or the upper limit error and/or the lower limit error may change during operation of the SMU). The weighting may be performed according to a function or in any other suitable manner. Non-limiting examples of weighting are described further below.

At stage 310, the weighted main error, weighted upper limit error, and weighted lower limit error may be combined in any suitable manner to generate the combined error signal. For example, the weighted errors maybe added in some embodiments. A non-limiting example is described further below in connection with FIG. 4.

Figure 4:
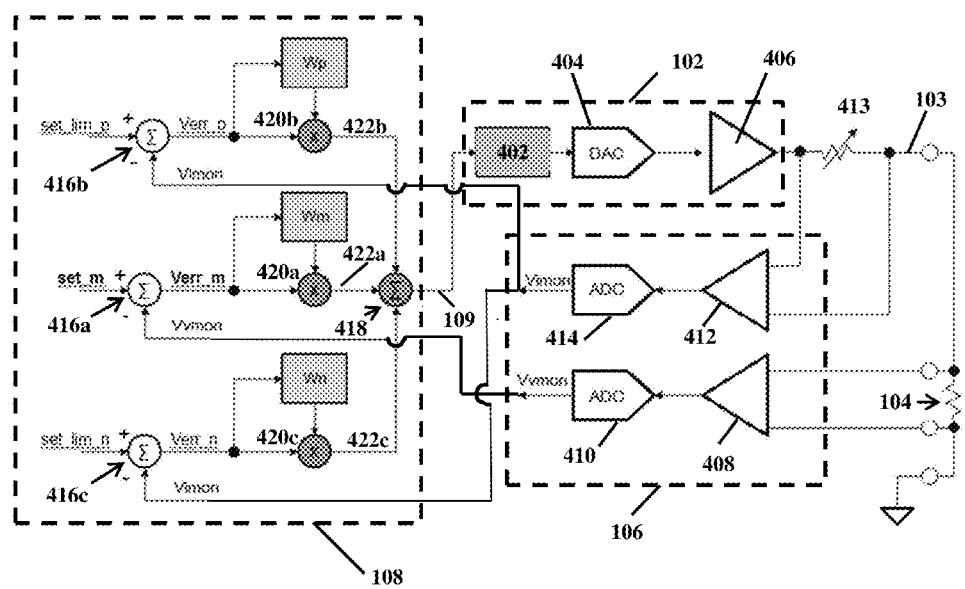
FIG. 4 illustrates a non-limiting detailed implementation of the SMU of FIG. 1, according to a non-limiting embodiment of the present application.

FIG. 4 illustrates a non-limiting detailed implementation of SMU 100 of FIG. 1 which is suitable for operating in accordance with the methods illustrated in FIGS. 2 and 3.

As described previously, the control circuit 102 may take any suitable form. In the non-limiting embodiment of FIG. 4, the control circuit 102 may be configured to receive a digital signal (i.e., the control signal 109 may be a digital signal in this non-limiting embodiment) and output an analog signal (i.e., the output signal 103 may be an analog signal in this non-limiting embodiment). The control circuit 102 may include a controller 402, a digital-to-analog converter (DAC) 404 and an amplifier 406. The controller 402 may be an integrator. In some embodiments, the controller 402 may be a proportional-integral-derivative (PID) controller, though other controllers may alternatively be used. The controller 402 may receive the control signal 109, which in some embodiments represents a combined or total error signal, and may generate a code for application to the DAC 404. The amplifier 406 may be a buffer amplifier, and in some embodiments may amplify current while providing unity gain of voltage.

The feedback circuit 106 may, in the non-limiting embodiment shown, include circuitry for generating distinct signals representing the voltage across the load 104 and the current through the load 104. In particular, the feedback circuit 106 may include a first amplifier 408 which may be a differential amplifier coupled across the load 104 (e.g., coupled to input and output terminals of the load 104) to provide a signal representative of the voltage across the load to an analog-to-digital converter (ADC) 410. The ADC 410 may output a signal Vvmon representative of the voltage across the load 104.

The feedback circuit 106 may also include an amplifier 412 coupled across a resistor 413 (which may be a variable resistor in some embodiments) to provide a signal to ADC 414 representative of the current through the load 104. The ADC 414 may then output a digital representation of the current through the load 104, labeled as Vimon. It should be appreciated that in the embodiment illustrated Vimon is a voltage representing the current through the load. However, not all embodiments are limited to generating a voltage representative of the current through the load.

While the example of FIG. 4 illustrates a configuration in which multiple (e.g., two in the example) distinct signals are taken to determine the voltage across the load and the current through the load, it should be appreciated that not all embodiments are limited in this respect. Rather, the feedback circuit 106 may utilize any one or more signals to determine the voltage across the load and the current through the load. For example, if the resistance of the load is known, then the signal from the amplifier 408 may provide both the voltage across the load and may be used to determine the current through the load. Thus, the voltage across the load and the current through the load may be determined from a single feedback signal in some embodiments.

The error generation circuit 108 may include suitable circuitry for generating the main error and upper and lower limit errors as described, for example, in connection with stages 302, 304, and 306 in FIG. 3. In particular, in the non-limiting embodiment illustrated, the error generation circuit 108 includes a first combination circuit 416a, which in some embodiments may be an adder or summation circuit, or a comparator. The first combination circuit 416a may receive the target value for the main signal, labeled as set_m in FIG. 4, as well as the previously described voltage signal Vvmon and may generate an error signal Verr_m representative of the error of the main signal relative to the target value for the main signal.

Similarly, the error generation circuit 108 may include a second combination circuit 416b which may be any of the types previously described in connection with 416a. The second combination circuit 416b may receive the positive (or upper in some embodiments) limit value (also referred to herein as the upper threshold value) of the limit signal, labeled as set_lim_p, as well as the previously described signal Vimon and may generate an error signal Verr_p representative of the error of the limit signal relative to the upper threshold value.

Similarly, the error generation circuit 108 may include a third combination circuit 416c which may be any of the types previously described in connection with 416a. The third combination circuit 416c may receive the negative (or lower in some embodiments) limit value (also referred to herein as the lower threshold value) of the limit signal, labeled as set_lim_n, as well as the previously described signal Vimon and may generate an error signal Verr_n representative of the error of the limit signal relative to the lower threshold value.

In some embodiments, Verr_m, Verr_p, Verr_n may be considered as different components (or sub-components) of the error of the drive signal produced by the SMU. The error generation circuit 108 may further comprise a combination circuit 418 (e.g., an adder or summation circuit) configured to combine (e.g., sum in some embodiments) the error components Verr_m, Verr_p, Verr_n to generate a combined error signal (or total error signal) which may be used as control signal 109. Thus, it should be appreciated that the control signal 109 used to control generation of a drive signal of a SMU may be based on errors in both the voltage and current of the drive signal, rather than being based on an error in only the voltage or the current.

As previously described in connection with stage 308 of FIG. 3, in some embodiments the error components representing errors in the main and limit signals may be weighted before being combined to generate a total error signal. The error generation circuit 108 shown in FIG. 4 may perform such weighting. Namely, as shown, the signals Verr_m, Verr_p, Verr_n may be weighted by weighting factors Wm, Wp, and Wn, respectively and then multiplied by respective multipliers 420a, 420b, and 420c to produce weighted error signals 422a-422c. In some embodiments, the control signal 109 produced by combination circuit 418 may represent a combination of the weighted error signals.

As described previously, when weighting (or, more generally, adjusting) of error signals is performed, any suitable weighting may be applied. For example, the weighting factors Wm, Wp, and Wn may be fixed values in some embodiments, or may be variable. In some embodiments, the weighting may be piece-wise linear, sine-based, Gaussian, or any other suitable weighting function. In some embodiments, the weighting may be a function of the error in the limit signal (rather than a function of the error in the main). For example, the weighting may be given in some embodiments by:

$$\text{Verr}\_p = \text{set\_lim}\_p - \text{Vimon}. \qquad \text{Eq. 1}$$

Other weighting functions may alternatively be applied.

Figure 5:
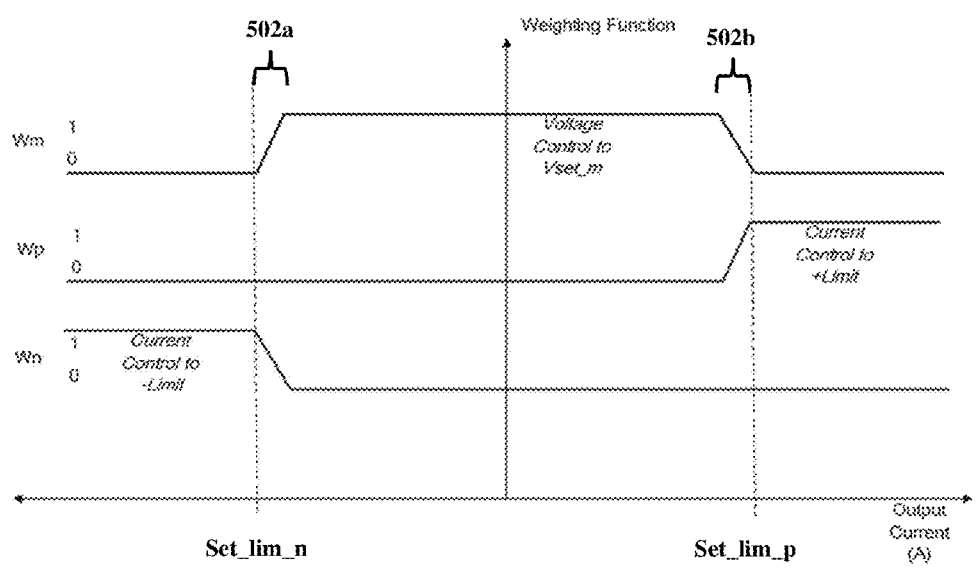
FIG. 5 illustrates weighting factor behavior for weighting error signals, according to a non-limiting embodiment.

FIG. 5 illustrates a non-limiting example of how the weighting factors Wm, Wp, and Wn may change during operation of the SMU shown in FIG. 4. In this non-limiting example, each of Wm, Wp, and Wn may be capable of having a value within the range from 0 to 1 and each may be defined by a piece-wise linear function. Moreover, the total of Wm+Wp+Wn may remain 1 during operation. FIG. 5 is illustrated based on the assumption that the SMU is operating in a voltage controlled mode in which the limit signal is current (labeled as "output current" on the x-axis) having positive and negative thresholds labeled as set_lim_p and set_lim_n.

As shown, when the output current is less than set_lim_n, Wn may be 1 and Wm and Wp may be zero. When the output current is within the compliance range (i.e., between set_lim_p and set_lim_n), Wm may be 1 and Wp and Wn may be 0, except for in the transition regions 502a and 502b described below. When the output current is greater than set_lim_p, Wp may be 1 and Wm and Wn may be 0. Thus, it should be appreciated that during normal operation when the limit signal is within the compliance range, there is no contribution from the limit errors to generation of the control signal.

Moreover, it should be appreciated that Wm, Wp, and Wn are defined by piece-wise linear functions in the non-limiting example of FIG. 5. Namely, each of Wm, Wp, and Wn assumes a constant value within certain segments of the operating space but assumes a linearly changing value in one or both of the transition regions 502a and 502b.

As shown in FIG. 5, transition regions 502a and 502b represent transitions between main mode control and limit mode control (e.g., between voltage controlled mode and current controlled mode). The transition regions are continuous as represented by the sloping lines for Wm, Wp, and Wn, rather than being abrupt. Thus, the transition regions represent gradual, or smooth, transfers of control from one mode to another. In the transition regions 502a and 502b, the drive signal of the SMU is based on both the voltage error(s) and current error(s). In this sense, the transition regions 502a and 502b may be considered to represent a mixed or shared mode of operation mixed/shared between voltage controlled and current controlled modes. Thus, voltage control and current control may operate simultaneously in varying or variable proportions.

Figure 6:
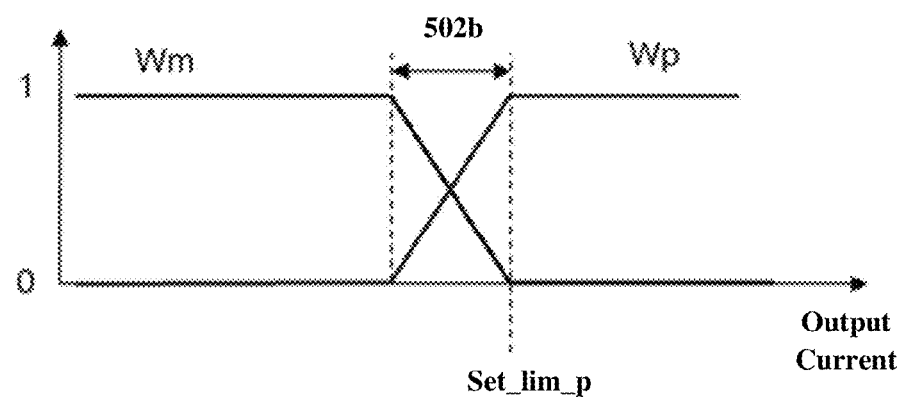
FIG. 6 provides an expanded view of a transition region from FIG. 5.

FIG. 6 illustrates a expanded view of the transition region 502b of FIG. 5, focusing on the values for Wm and Wp (i.e., ignoring Wn). As shown, when the limit signal is (well) within the compliance range, Wm is 1 and Wp is 0. However, as the limit signal approaches set_lim_p, transition of control from the main control to the limit control begins. Namely, Wm and Wp both adjust smoothly or continuously until the output current reaches set_lim_p and control is transferred fully from the main control to the limit control.

The rate (in terms of the change of the weighting factor for a given change in the error signal) at which Wm, Wp, and Wn change in the transition regions 502a and 502b may be any suitable rate to provide a smooth transition avoiding undesirable behavior (e.g., chatter) in the output signal of the SMU, or any other desired rate. As a non-limiting example, the transition regions may span approximately 0.2 Volts when the error signal is expressed as a voltage (e.g., Vimon or Vvmon). In some embodiments, the transition regions may span voltages changes in the error signal of between 0.1 Volt and 1 Volt, between 0.2 Volts and 0.5 Volts, any values within those ranges, or any other suitable voltage gap. It should also be appreciated that the piece-wise linear functions illustrated in FIG. 5 may be more complex in some embodiments. For example, additional inflection points of the function may be implemented. The illustrated linear transition regions may instead have multiple portions of different slopes, or other suitable behavior.

It should be noted that in some embodiments the values of Wm, Wp, and Wn sum to 1 which may provide operational stability, though not all embodiments are limited in this respect.

A specific non-limiting example of the manner of determining weighting factors Wm, Wp, and Wn and thus a combined error signal is now provided. A positive weighting function may be implemented in which the weighting factors are a function of the positive limit error (e.g., Wp(Verr_p) with Verr_p given by Eq. 1). The value of Wm may then be given by Wm=1−Wp. The total error (e.g., out of combination circuit 418 in FIG. 4) may then be given by:

$$Verr\_sum = ((1-Wp) \times (1-Wn) \times Verr\_m) + (Wp \times Verr\_p) + (Wn \times Verr\_n).$$

In some embodiments, Wm, Wp, and Wn may be calculated on-the-fly (e.g., during operation) of the SMU. However, in some embodiments a look-up table may be used to lookup values of Wm, Wp, and Wn. Alternatives are possible.

FIGS. 5 and 6 illustrate scenarios in which mode switching is completed, i.e., control is transferred fully from main control to limit control or vice versa. It should be appreciated that not all embodiments require such a transition. Rather, for example, at some time during transition from main control to limit control (or vice versa), the voltage and current values of the output signal of the SMU may be such that control begins to shift back in the other direction. The ability of the circuits and methods described herein to accommodate such shifting back and forth in a smooth manner may be a further benefit to providing desirable or acceptable behavior in the output signal of the SMU.

The aspects of the present application may provide one or more benefits. Described now are some non-limiting examples of such benefits. It should be appreciated that not all aspects and embodiments necessarily provide all of the benefits now described. Further, it should be appreciated that aspects of the present application may provide additional benefits to those now described.

Some aspects of the present application provide a manner of switching between voltage controlled and current controlled modes of a SMU (or V/I source) that reduces or eliminates noise, chatter, or other undesirable signal behavior at the output of the SMU. Some aspects provide sliding scale control capability to slide between discrete modes of operation of the SMU (e.g., between voltage and current controlled modes). Some aspects of the present application provide a SMU with adjustable control between voltage controlled and current controlled modes, thus increasing flexibility in the use of the SMU.

Some aspects of the present application provide simple SMUs. For example, it should be appreciated that the SMU of FIG. 4 lacks any state machine and also lacks hysteresis circuitry. State machines and hysteresis circuits are generally complex and therefore the SMUs according to aspects of the present application may be relatively simple in design and operation. Other benefits may also be provided according to the various aspects of the present application.

The SMUs and methods described herein may be used in various contexts. As previously described, in some embodiments SMUs may be used as part of ATE when testing a DUT. However, the aspects described herein are not limited to use in the ATE context. Rather, aspects of the present application may apply more generally to provision of a V/I source for driving a load of various types. Moreover, various aspects of the present application may be used with either analog or digital control loops.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present application involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Elements other than those specifically identified by the "and/or" clause may optionally be present, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of operating a source measure unit (SMU) configured to couple to a load, the SMU operating in a plurality of modes including a voltage-controlled mode and a current-controlled mode, the method comprising:
   generating a control signal to apply to a control circuit of the SMU when switching between the plurality of modes, wherein generating the control signal comprises combining a first signal, a second signal and a third signal,
       wherein the first signal is indicative of a voltage error of a voltage across the load relative to a target voltage,
       wherein the second signal is indicative of a first current error of a current through the load relative to an upper current threshold, and
       wherein the third signal is indicative of a second current error of the current through the load relative to a lower current threshold.

2. The method of claim 1, wherein the first signal is indicative of a voltage error of the voltage detected across the load relative to a target voltage of a drive signal of the SMU.

3. The method of claim 1, wherein combining the first signal, the second signal and the third signal comprises generating a weighted combination of the first signal and the second signal.

4. The method of claim 1, wherein combining the first signal, the second signal and the third signal comprises generating a weighted combination of the first signal, the second signal, and the third signal.

5. The method of claim 4, wherein a first weighting factor is associated with the first signal, a second weighting factor is associated with the second signal, and a third weighting factor is associated with the third signal, and wherein a sum of the first weighting factor, the second weighting factor, and the third weighting factor is one.

6. The method of claim 5, wherein the first weighting factor and/or the second weighting factor and/or the third weighting factor is variable.

7. The method of claim 6, wherein the first weighting factor and/or second weighting factor and/or third weighting factor is generated by a function.

8. The method of claim 7, wherein the function is dependent on voltage.

9. The method of claim 8, wherein the function is dependent on voltage error.

10. The method of claim 7, wherein the function is dependent on current.

11. The method of claim 10, wherein the function is dependent on current error.

12. The method of claim 1, wherein the load is a device under test (DUT).

13. A method of operating a source measure unit (SMU) configured to couple to a load, the SMU operating in a plurality of modes including a voltage-controlled mode and a current-controlled mode, the method comprising:
   generating a control signal to apply to a control circuit of the SMU when switching between the plurality of modes, wherein generating the control signal comprises combining a first signal, a second signal and a third signal,
       wherein the first signal is indicative of a first voltage error of a voltage across the load relative to an upper voltage threshold,
       wherein the second signal is indicative of a current error of a current through the load relative to a target current, and
       wherein the third signal is indicative of a second voltage error of the voltage across the load relative to a lower voltage threshold.

14. The method of claim 13, wherein combining the first signal, the second signal and the third signal comprises generating a weighted combination of the first signal, the second signal, and the third signal.

15. The method of claim 14, wherein a first weighting factor is associated with the first signal, a second weighting factor is associated with the second signal, and a third weighting factor is associated with the third signal, and wherein a sum of the first weighting factor, the second weighting factor, and the third weighting factor is one.

16. The method of claim 15, wherein the first weighting factor and/or the second weighting factor and/or the third weighting factor is variable.

17. The method of claim 16, wherein the first weighting factor and/or second weighting factor and/or third weighting factor is generated by a function.

18. The method of claim 17, wherein the function is dependent on voltage.

19. The method of claim 18, wherein the function is dependent on voltage error.

20. The method of claim 17, wherein the function is dependent on current.

21. The method of claim 20, wherein the function is dependent on current error.

22. A source measure unit (SMU) configured to operate in a plurality of modes including a voltage-controlled mode and a current-controlled mode, the SMU comprising:
   combination circuitry configured to generate, when the SMU transitions between the voltage-controlled mode and the current controlled mode, a control signal to provide to a control circuit of the SMU, the control signal being generated by combining a first signal, a second signal and a third signal,
       wherein the first signal is indicative of a voltage error of a voltage relative to a target voltage,
       wherein the second signal is indicative of a first current error of a current relative to an upper current threshold, and
       wherein the third signal is indicative of a second current error of the current relative to a lower current threshold.

23. The SMU of claim 22, wherein the combination circuitry comprises weighting circuitry configured to form a weighted combination of the first signal, the second signal, and the third signal.

24. A source measure unit (SMU) configured to operate in a plurality of modes including a voltage-controlled mode and a current-controlled mode, the SMU comprising:
    combination circuitry configured to generate, when the SMU transitions between the voltage-controlled mode and the current controlled mode, a control signal to provide to a control circuit of the SMU, the control signal being generated by combining a first signal, a second signal and a third signal,
        wherein the first signal is indicative of a first voltage error of a voltage relative to an upper voltage threshold,
        wherein the second signal is indicative of a current error of a current relative to a target current, and
        wherein the third signal is indicative of a second voltage error of the voltage relative to a lower voltage threshold.

25. The SMU of claim 24, wherein the combination circuitry comprises weighting circuitry configured to formed a weighted combination of the first signal, the second signal, and the third signal.

* * * * *